US009841772B2

(12) United States Patent
Bucher

(10) Patent No.: US 9,841,772 B2
(45) Date of Patent: Dec. 12, 2017

(54) TEMPERATURE RESPONSIVE THERMAL BRIDGE

(71) Applicant: TYCO ELECTRONICS CORPORATION, Berwyn, PA (US)

(72) Inventor: Alan Weir Bucher, Manheim, PA (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 0 days.

(21) Appl. No.: 14/958,137

(22) Filed: Dec. 3, 2015

(65) Prior Publication Data

US 2017/0164510 A1 Jun. 8, 2017

(51) Int. Cl.
*H05K 7/20* (2006.01)
*G05D 23/02* (2006.01)
*H04B 10/50* (2013.01)

(52) U.S. Cl.
CPC ........... *G05D 23/02* (2013.01); *H04B 10/503* (2013.01)

(58) Field of Classification Search
CPC .................. H05K 7/2039; G05D 23/01–23/02
See application file for complete search history.

(56) References Cited

U.S. PATENT DOCUMENTS 3,362,467 A * 1/1968 Kummerer ............... B64G 1/50 165/185
3,364,746 A * 1/1968 Misauskas ............ G05D 23/02 236/101 B
4,800,956 A * 1/1989 Hamburgen ........ H01L 23/4338 165/185
5,515,912 A * 5/1996 Daikoku ............. H01L 23/4338 165/185
5,838,065 A * 11/1998 Hamburgen .......... H01L 23/367 257/712
5,948,689 A * 9/1999 Hamburgen .......... H01L 23/367 257/722
6,034,430 A * 3/2000 Hamburgen .......... H01L 23/367 257/712
6,396,693 B1 * 5/2002 Shih .................... H01L 23/3672 257/E23.099
6,604,575 B1 * 8/2003 Degtiarenko ........... F28F 1/124 165/185

(Continued)

OTHER PUBLICATIONS

G. Min et al,, "Variable Thermal Resistor Based on Self-Powered Peltier Effect", IOP Publishing Ltd, Oct. 23, 2008, 3 pages.

*Primary Examiner* — Robert J Hoffberg

(57) ABSTRACT

A thermal bridge includes a first plate stack, a second plate stack and a temperature responsive actuator. The first plate stack is placed in thermal communication with a first electrical component and has a plurality of first plates. The second plate stack is placed in thermal communication with a second electrical component and has a plurality of second plates interleaved with the first plates. The temperature responsive actuator is coupled to at least one of the first and second plate stacks. The temperature responsive actuator changes shape based on changes in temperature to change the relative positions of the first and second plates. The temperature responsive actuator causes the first and second plates to vary thermal resistance between the first and second electrical components based on the change in relative positions of the first and second plates.

20 Claims, 4 Drawing Sheets

100 114 110 112 104 106 102 116

110 114 116 6 6 122 132 154 152 150 112

(56) References Cited

U.S. PATENT DOCUMENTS

| | | | | | |
|---|---|---|---|---|---|
| 7,215,071 | B2 * | 5/2007 | Bucher | H01J 29/073 | |
| | | | | | 313/402 |
| 7,308,008 | B2 * | 12/2007 | Freeman | H01L 23/34 | |
| | | | | | 257/E23.08 |
| 7,532,475 | B2 * | 5/2009 | Michel | H01L 23/3733 | |
| | | | | | 165/185 |
| 2006/0060328 | A1 * | 3/2006 | Ewes | H01L 23/427 | |
| | | | | | 165/80.2 |
| 2012/0293952 | A1 * | 11/2012 | Herring | H01L 23/367 | |
| | | | | | 361/679.54 |
| 2015/0280368 | A1 * | 10/2015 | Bucher | H01R 13/665 | |
| | | | | | 439/487 |

* cited by examiner

TEMPERATURE RESPONSIVE THERMAL BRIDGE

BACKGROUND OF THE INVENTION

The subject matter herein relates generally to thermal bridges.

Thermal bridges are used to thermally couple one electrical component with another electrical component of an electronic system to transfer heat to or away from such electrical component. For example, in one particular application, the thermal bridge transfers heat away from one electrical component, such as a processor, to another electrical component, such as a heat sink of the electronic system. In other applications, the thermal bridge is used to heat up an electrical component rather than to remove heat from the electrical component. For example, a heat generating component may be used to heat up a non-heat generating component.

However, control of heat transfer is difficult using conventional thermal bridges. A need remains for a thermal bridge that provides self-regulating heat transfer between electrical components.

BRIEF DESCRIPTION OF THE INVENTION

In one embodiment, a thermal bridge between first and second electrical components is provided including a first plate stack, a second plate stack and a temperature responsive actuator. The first plate stack is configured to be placed in thermal communication with the first electrical component. The first plate stack has a plurality of first plates. The second plate stack is configured to be placed in thermal communication with the second electrical component. The second plate stack has a plurality of second plates interleaved with the first plates. The temperature responsive actuator is coupled to at least one of the first and second plate stacks. The temperature responsive actuator changes shape based on changes in temperature to change the relative positions of the first and second plates. The temperature responsive actuator causes the first and second plates to vary thermal resistance between the first and second electrical components based on the change in relative positions of the first and second plates.

In another embodiment, a thermal bridge between first and second electrical components is provided including a first plate stack having a first base and a plurality of first plates extending from the first base. The first plates are separated by first channels. The first base is configured to be placed in thermal communication with the first electrical component. The thermal bridge includes a second plate stack having a second base and a plurality of second plates extending from the second base. The second plates are separated by second channels. The second base is configured to be placed in thermal communication with the second electrical component. The second plates are received in the first channels and the first plates are received in the second channels such that gaps are defined between the first and second plates. A temperature responsive actuator is coupled to at least one of the first and second plate stacks. The temperature responsive actuator changes shape based on changes in temperature to cause the first plates and the second plates to change relative positions and change sizes of the gaps to vary thermal resistance between the first and second electrical components.

In a further embodiment, an electronic device is provided including a first electrical component, a second electrical component, and a thermal bridge between first and second electrical components. The thermal bridge includes a first plate stack in thermal communication with the first electrical component and a second plate stack in thermal communication with the second electrical component. The first plate stack has a plurality of first plates and the second plate stack has a plurality of second plates interleaved with the first plates. The thermal bridge includes a temperature responsive actuator coupled to at least one of the first and second plate stacks. The temperature responsive actuator changes shape based on changes in temperature to change the relative positions of the first and second plates. The temperature responsive actuator causes the first and second plates to vary thermal resistance between the first and second electrical components based on the change in relative positions of the first and second plates.

DETAILED DESCRIPTION OF THE INVENTION

Figure 1:
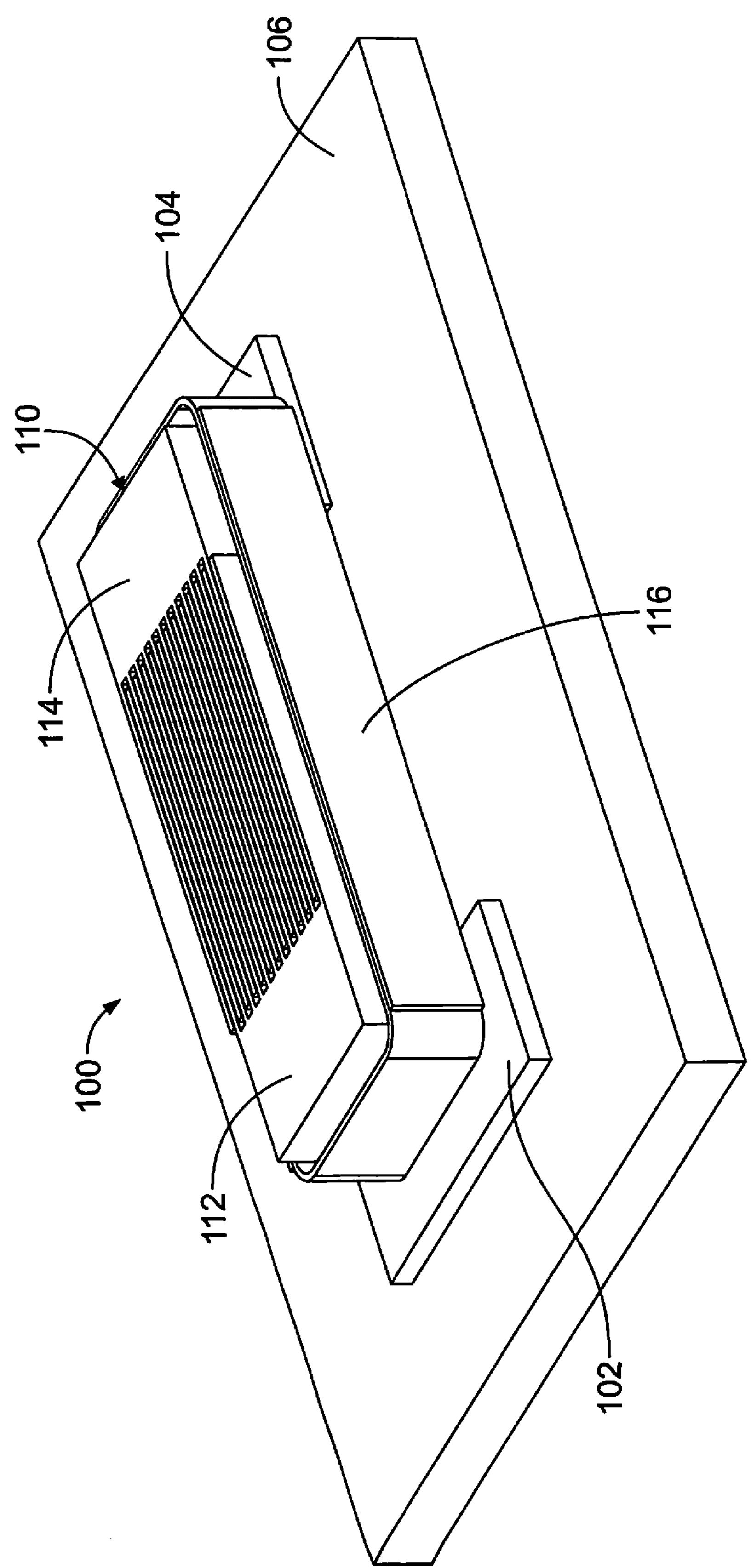
FIG. 1 illustrates an electronic device including a thermal bridge formed in accordance with an exemplary embodiment.

FIG. 1 illustrates an electronic device 100 formed in accordance with an exemplary embodiment. The electronic device 100 includes a first electrical component 102 and a second electrical component 104 forming parts of electrical systems of the electronic device 100. In the illustrated embodiment, the electronic device 100 includes a circuit board 106 on which the first and second electrical components 102, 104 are mounted. However, in alternative embodiments, the first electrical component 102 and/or the second electrical component 104 may be mounted to another structure or portion of the electronic device 100 rather than being mounted to the circuit board 106. Optionally, the first electrical component 102 and/or the second electrical component 104 may be electrically connected to the circuit board 106, such as to one or more circuits of the circuit board 106. The first and second electrical components 102, 104 may be electrically connected to other electrical components of the electronic device 100 through circuits of the circuit board 106. The first and second electrical components 102, 104 may or may not be electrically connected to each other through circuits of the circuit board 106.

The electronic device 100 includes a thermal bridge 110 that is thermally coupled between the first and second electrical components 102, 104. The thermal bridge 110 transfers heat between the first and second electrical components 102, 104. Optionally, the thermal bridge 110 may be used to raise the temperature of one component using heat generated by the other component. Additionally or alternatively, the thermal bridge 110 may be used to cool or dissipate heat from one of the components by transferring heat from such component to the other component. Optionally, the thermal bridge 110 may be used to heat one component, such as a non-heat generating component, using the heat generated by another component, such as a heat generating component. As such, the thermal bridge 110 allows heating of the component without providing or without operating an active heating element for such component. As such, the number of overall components of the electronic device 100 may be reduced. The amount of power consumption of the electronic device 100 may be reduced by reducing the use of or eliminating the need for a dedicated heater or other heating component for the non-heat generating component by using excess heat generated by the other necessary heat generating component.

In one particular application, the first electrical component 102 is sensitive to temperature variation and should be operated in a predetermined temperature range for normal or optimal performance. When the ambient temperature falls, the temperature of the first electrical component 102 may fall below the predetermined range causing the first electrical component 102 to operate sub-optimally. The first electrical component 102 may include a dedicated heater to control the temperature of the first electrical component 102 when the ambient temperature falls and the temperature of the first electrical component 102 is below the predetermined range. However, such heater requires power for operation. The thermal bridge 110 is used to transfer heat from the second electrical component 104 to the first electrical component 102 to raise the temperature of the first electrical component 102 such as to the predetermined range. The thermal bridge 110 may transfer the heat to the first electrical component 102 without needing the dedicated heater, thus reducing power consumption by the electronic device 100. In other various embodiments, the electronic device 100 may not include a dedicated heater, but rather may rely upon the thermal bridge 110 to supply all of the additional heat to the first electrical component 102 when needed.

In one particular embodiment, the first electrical component 102 is a laser based communication device. The communication device receives electrical signals and operates a laser to send signals, such as optical signals. The laser is sensitive to temperature. For example, the wavelength of the laser may modulate or change based on temperature shifts. Other types of temperature sensitive electrical components may be used in alternative embodiments. The second electrical component may be a modulator, an optical/electrical converter, or another heat generating component.

In an exemplary embodiment, the thermal bridge 110 sheds heat from the second electrical component 104 when the first electrical component 102 cools, such as when the ambient temperature cools. Optionally, the thermal bridge 110 does not shed heat, or sheds less heat, to the first electrical component 102 when the first electrical component 102 is at a predetermined temperature, such as when the ambient environment is above the predetermined temperature. As such, the heat transfer may be variable. For example, the thermal bridge 110 sheds heat from the second electrical component 104 to the first electrical component 102 in some circumstances and not in other circumstances.

The thermal bridge 110 includes a first plate stack 112 configured to be placed in thermal communication with the first electrical component 102, and a second plate stack 114 configured to be placed in thermal communication with the second electrical component 104. The thermal bridge 110 includes a temperature responsive actuator 116 coupled to at least one of the first and second plate stacks 112, 114. The temperature responsive actuator 116 changes shape based on changes in temperature to change the relative positions of the first and second plate stacks 112, 114. The temperature responsive actuator 116 causes the first and second plate stacks 112, 114 to vary thermal resistance between the first and second electrical components 102, 104 based on the change in relative positions in the first and second plate stacks 112, 114. As such, the thermal bridge 110 is temperature responsive to vary thermal resistance between the first and second electrical components 102, 104.

In various embodiments, as the ambient temperature cools, the temperature responsive actuator 116 may cause the first and second plate stacks 112, 114 to more closely couple, thus lowering the thermal resistance and causing a greater amount of heat transfer between the first and second electrical components 102, 104. In an exemplary embodiment, as the temperature cools, the temperature responsive actuator 116 squeezes the first and second plate stacks 112, 114 together, thereby increasing the heat transfer between the first plate stack 112 and the second plate stack 114. However, as the ambient temperature increases, the temperature responsive actuator 116 may change shape causing the first and second plate stacks 112, 114 to become less thermally coupled thus raising the thermal resistance of the thermal bridge 110. As the thermal resistance increases, the heat transfer decreases causing less thermal transfer from the second electrical component 104 to the first electrical component 102. As such, the heat transfer may be throttled based on the ambient temperature.

Figure 2:
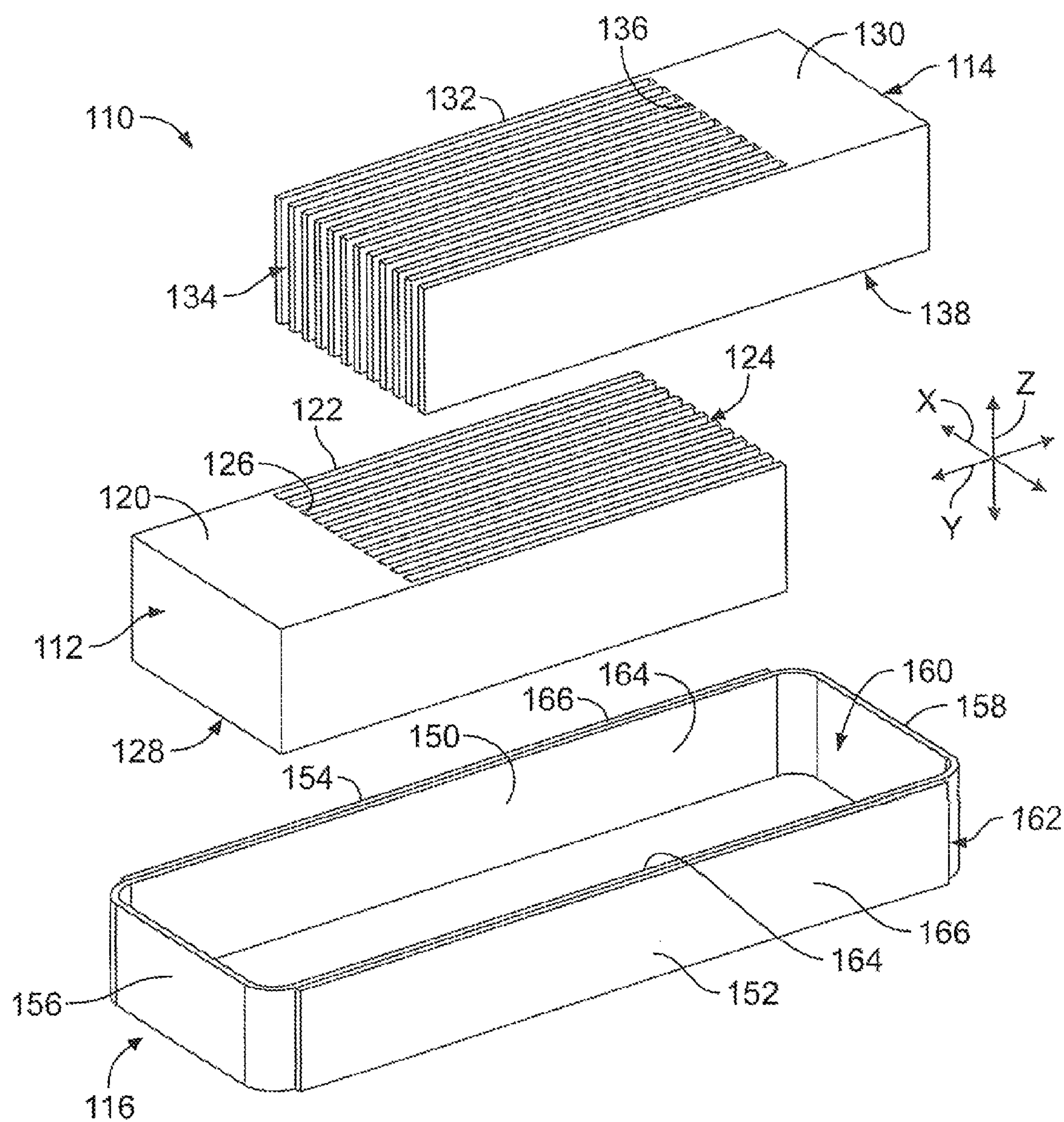
FIG. 2 is an exploded view of the thermal bridge in accordance with an exemplary embodiment.

FIG. 2 is an exploded view of the thermal bridge 110 showing the first plate stack 112, the second plate stack 114 and the temperature responsive actuator 116. The first and second plate stacks 112, 114 are configured to be internested and thermally coupled to each other. The first and second plate stacks 112, 114 may be manufactured from a material having a high thermal conductivity, such as copper material, to allow efficient heat transfer therebetween. The temperature responsive actuator 116 is configured to be coupled to the first and second plate stacks 112, 114 to control the amount of thermal coupling of the first and second plate stacks 112, 114 such as by varying the thermal resistance. In the illustrated embodiment, the temperature responsive actuator 116 is a band configured to wrap entirely around the first and second plate stacks 112, 114. The first and second plate stacks 112, 114 are received inside the temperature responsive actuator 116.

The first plate stack 112 includes a first base 120 and a plurality of first plates 122 extending from the first base 120. The first plates 122 are separated by first channels 124. Any number of first plates 122 may extend from the first base 120. In the illustrated embodiment, the first plates 122 all extend from a common edge 126 of the first base 120. The first plates 122 extend toward the second plate stack 114. In the illustrated embodiment, the first plates 122 are generally parallel plates having a width, a length, and a height measured in mutually perpendicular x, y and z directions. The first channels 124 have widths, which may be approximately equal to the widths of the first plates 122. Optionally, the first channels 124 may be slightly wider than the first plates 122. Optionally, the first plates 122 may have a height approximately equal to the height of the first base 120.

The base 120 includes a thermal interface 128 at a bottom of the base 120. The thermal interface 128 is configured to be coupled to the first electrical component 102 (shown in FIG. 1). For example, the first base 120 may be mounted directly to the first electrical component 102 such that the thermal interface 128 directly engages the first electrical component 102. Optionally, thermal interface material may be provided at the thermal interface 128 or on the first electrical component 102 to enhance thermal contact between the first base 120 and the first electrical component 102. For example, thermal grease may be applied between the thermal interface 128 and the first electrical component 102.

The second plate stack 114 includes a second base 130 and a plurality of second plates 132 extending from the second base 130. The second plates 132 are separated by second channels 134. Any number of second plates 132 may extend from the second base 130. In the illustrated embodiment, the second plates 132 all extend from a common edge 136 of the second base 130. The second plates 132 extend toward the first plate stack 112. The first and second plate stacks 112, 114 are oriented relative to each other such that the first and second plates 122, 132 are interleaved. For example, the second plates 132 are nested in the first channels 124 while the first plates 122 are nested in the second channels 134.

In the illustrated embodiment, the second plates 132 are generally parallel plates having a width, a length, and a height measured in the mutually perpendicular x, y and z directions. The second channels 134 have widths, which may be approximately equal to the widths of the second plates 132. Optionally, the second channels 134 may be slightly wider than the second plates 132. Optionally, the second plates 132 may have a height approximately equal to the height of the second base 130.

The base 130 includes a thermal interface 138 at a bottom of the base 130. The thermal interface 138 is configured to be coupled to the second electrical component 104 (shown in FIG. 1). For example, the second base 130 may be mounted directly to the second electrical component 104 such that the thermal interface 138 directly engages the second electrical component 104. Optionally, thermal interface material may be provided at the thermal interface 138 or on the second electrical component 104 to enhance thermal contact between the second base 130 and the second electrical component 104. For example, thermal grease may be applied between the thermal interface 138 and the second electrical component 104.

In an exemplary embodiment, gaps are defined between the first and second plates 122, 132. For example, the first and second channels 124, 134 may be wider than the corresponding plates 132, 122 received therein such that gaps are formed between the plates 122, 132. The gaps may be relatively small such that the first and second plates 122, 132 are in close proximity to each other. The gaps increase the thermal resistance between the first and second plates 122, 132. The gaps may be filled with air and/or another substance that allows variable thermal resistance based on the relative positions of the plates 122, 132. For example, the gaps may be at least partially filled with thermal grease, such as covering the plates 122, 132.

The temperature responsive actuator 116 causes the first and second plates 122, 132 to change relative positions and change sizes of the gaps (for example, reduce or expand) to vary the thermal resistance between the first and second plate stacks 112, 114. For example, the temperature responsive actuator 116 may squeeze the first and second plates 122, 132 together such that the size of the gaps is reduced and/or eliminated. As the temperature responsive actuator contracts, the first and second plates 122, 132 are positioned closer to each other, and in some circumstances may engage each other, to increase the amount of heat transfer between the first and second plate stacks 112, 114.

The temperature responsive actuator 116 includes a band 150 wrapping around the first and second plate stacks 112, 114. The band 150 includes first and second sides 152, 154 extending between first and second ends 156, 158. The band 150 surrounds a generally rectangular cavity 160 that receives the first and second plate stacks 112, 114. The band 150 may have other shapes in alternative embodiments. Optionally, the corners may be curved. In the illustrated embodiment, the sides 152, 154 are longer than the ends 156, 158. The sides 152, 154 extend along and generally parallel to the plates 122, 132. Optionally, the sides 152, 154 may engage the plates 122 and/or 132.

In an exemplary embodiment, the temperature responsive actuator 116 is manufactured from temperature responsive material that changes shape based on changes in temperature. For example, portions of the band 150 may contract and expand based on the ambient temperature. For example, the sides 152, 154 may contract when cooled and expand when heated, or vice versa. The ends 156, 158 may additionally expand and contract based on changes in temperature.

In an exemplary embodiment, the band 150 includes at least one first member 164 and at least one second member 166. Optionally, the first and second members 164, 166 may define a bimetal spring 162. The second member 166 is coupled to the first member 164 along the shared length therewith. The second member 166 may be coupled to the first member 164 such as by welding or other securing processes. Optionally, the first member 164 may wrap entirely around the band 150 and second members 166 are coupled to an exterior surface of the first member 164 along the first and second sides 152, 154. The second members 166 may be positioned along the interior of the first member 164 in alternative embodiments.

The first member 164 is manufactured from a first metal material while the second members 166 are manufactured from a second metal material different from the first metal material. The metal materials of the first and second members 164, 166 have different coefficients of thermal expansion such that the band 150 changes shape based on changes in temperature. The band 150 converts temperature changes into mechanical displacement. For example, in an exemplary embodiment, the first member 164 may have a lower coefficient of thermal expansion than the second member 166, which has a higher coefficient of thermal expansion than the first member 164. As such, when the temperature cools, the second member 166 may shrink or reduce in size more than the first member 164 causing the first and second sides 152, 154 to pinch inward.

Other arrangements are possible in alternative embodiments. For example, the first member 164 may be manufactured from a material having a higher coefficient thermal expansion than the second members 166. Such arrangement may cause the band 150 to contract or pinch inward as the ambient temperature increases. Optionally, in an exemplary embodiment, the lower coefficient of thermal expansion material may be an iron-nickel alloy while the higher coefficient of thermal expansion material may be a stainless steel material. Other materials may be used in alternative embodiments.

Figure 3:
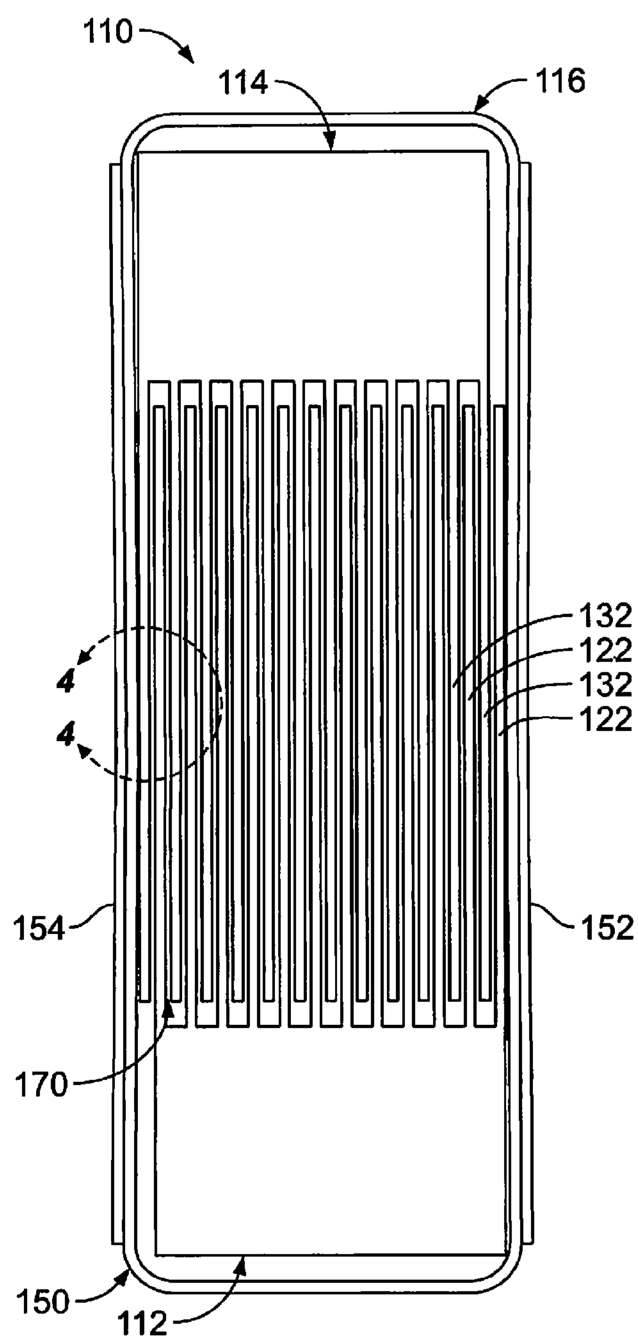
FIG. 3 is a top view of the thermal bridge in an expanded state.
Figure 4:
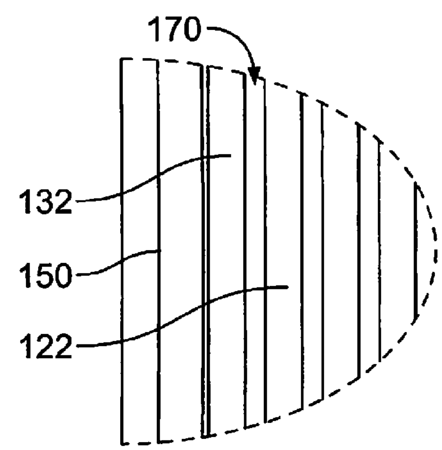
FIG. 4 is an enlarged view of a portion of the thermal bridge in the expanded state.
Figure 5:
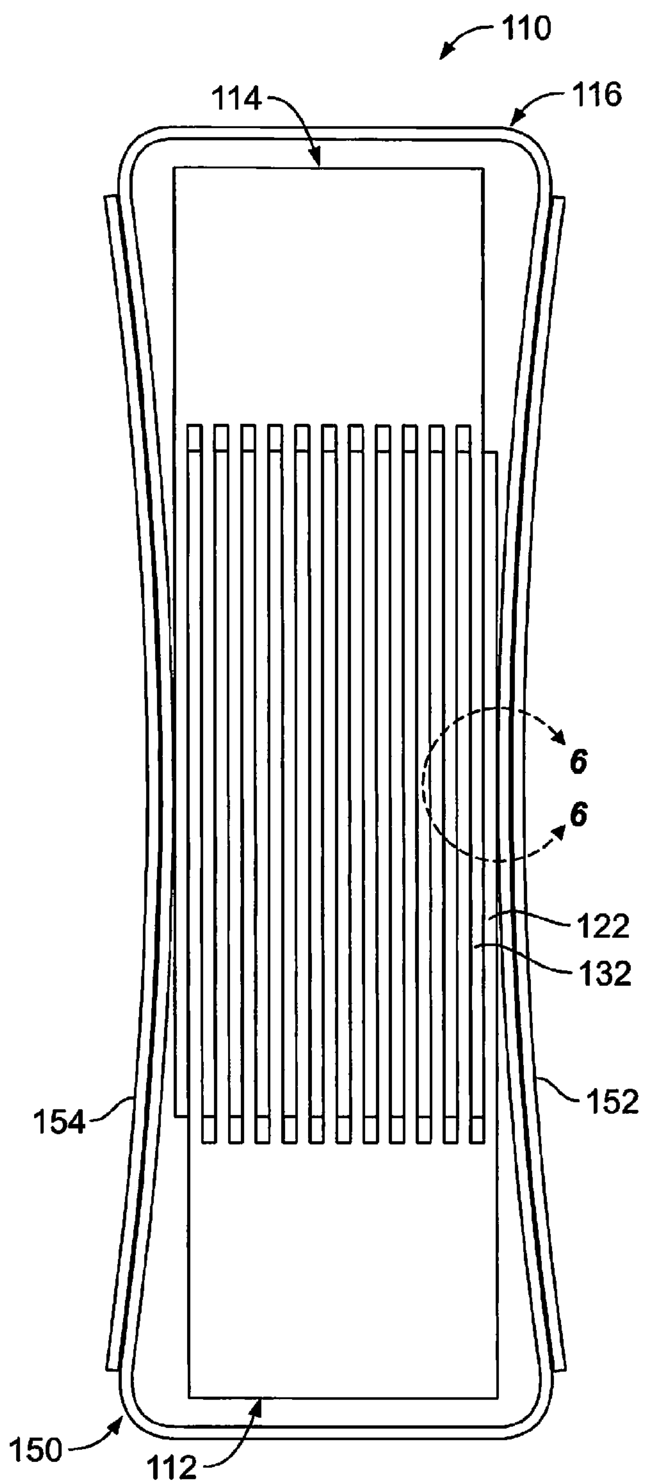
FIG. 5 is a top view of the thermal bridge in a contracted state.
Figure 6:
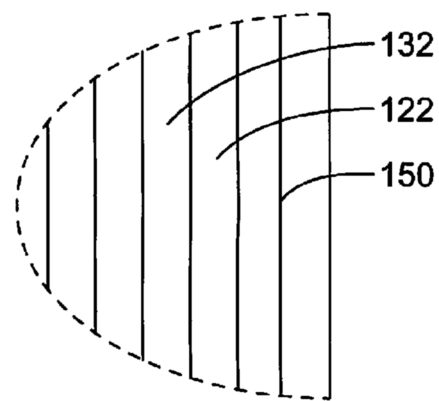
FIG. 6 is an enlarged view of a portion of the thermal bridge in the contracted state.

FIG. 3 is a top view of the thermal bridge 110 in an expanded state. FIG. 4 is an enlarged view of a portion of the thermal bridge 110 in the expanded state. FIG. 5 is a top view of the thermal bridge 110 in a contracted state. FIG. 6 is an enlarged view of a portion of the thermal bridge 110 in the contracted state.

When assembled, the plates 122, 132 of the first and second plate stacks 112, 114 are interleaved with gaps 170

(FIGS. 3 and 4) defined between adjacent plates 122, 132. The gaps 170 have thermal resistance thus reducing heat transfer between the plates 122, 132. The gaps 170 may be filled with air and/or another substance that allows variable thermal resistance based on the relative positions of the plates 122, 132. The width of the gaps 170, and thus the volume of air between the plates 122, 132, affects the thermal resistance. The temperature responsive actuator 116 changes shape based on changes in temperature to change the relative positions of the first and second plates 122, 132, and thus change the shape/volume of the gaps 170. For example, as the ambient temperature decreases and cools, the temperature responsive actuator 116 may contract causing the sides 152, 154 of the band 150 to flex inward toward the contracted state (FIGS. 5 and 6). As the sides 152, 154 contract inward, the sides 152, 154 press inward against the plates 122, 132. As the plates 122, 132 are pressed inward, the size of the gaps 170 is decreased, and may be entirely eliminated in some cases. As the gaps 170 are reduced, the thermal resistance is lowered and the amount of heat transfer is increased. The plates 122, 132 may have thermal grease on the surfaces thereof to increase heat transfer between the plates 122, 132 when the plates 122, 132 are brought into close proximity and/or pressed together.

The widths of the gaps 170 may be variable along the lengths of the plates 122, 132 and/or may be variable across the width of the plate stacks 112, 114. For example, as the band 150 begins to compress the plates 122, 132, the plates may initially be pinched together near the center of the plate stacks 112, 114, thus reducing the gaps 170 near the center; however, the gaps 170 may remain largely unchanged remote from the center. As such, the widths of the gaps 170 may vary along the lengths of the plates 122, 132 as the temperature responsive actuator 116 transitions from the expanded position to the contracted position. Optionally, as the band 150 begins to move from the expanded position toward the contracted position, the band 150 is flexed inward. For example, the sides 152, 154 may take on a concave arcuate shape. The band 150 may initially press against the outer most plates 122, 132 (for example, those plates 122, 132 closest to the sides 152, 154) reducing or eliminating the gaps 170 between the outer most plates 122, 132; however, the plates 122, 132 near the middle of the plates stacks 112, 114 may initially be unaffected by the pinching of the band 150, thus leaving the gaps 170 between those plates 122, 132 near the middle of the plate stacks 112, 114. As the band 150 continues to pinch inward, more and more of the plates 122, 132 may be pinched inward toward each other, thus reducing the gaps 170 between such plates 122, 132. In the contracted state, the gaps 170 between all of the plates 122, 132 may be substantially or entirely removed such that all of the plates 122, 132 directly contact the adjacent plates 122, 132. The thermal resistance between the first and second plate stacks 112, 114 is variable as the temperature responsive actuator 116 moves from the expanded state to the contracted state.

In an exemplary embodiment, the temperature responsive actuator 116 contracts when cooled to compress the first and second plate stacks 112, 114 causing the first and second plates 122, 132 to move closer to each other as the ambient temperature decreases. In an alternative embodiment, the temperature responsive actuator 116 contracts when heated to compress the first and second plate stacks 112, 114 causing the first and second plates 122, 132 to move closer to each other when the ambient temperature increases. In an exemplary embodiment, the temperature responsive actuator 116 expands when heated to cause the first and second plates 122, 132 to spread apart from each other, thus increasing the size of the gaps 170 and raising the thermal resistance as the temperature increases. In an alternative embodiment, the temperature responsive actuator 116 expands when cooled to cause the first and second plates 122, 132 to spread apart from each other, thus increasing the size of the gaps 170 and raising the thermal resistance as the temperature decreases.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112(f) unless and until such claim limitations expressly use the phrase "means for" followed by a statement of function void of further structure.

What is claimed is:

1. A thermal bridge between first and second electrical components, the thermal bridge comprising:

a first plate stack configured to be placed in thermal communication with the first electrical component, the first plate stack having a plurality of first plates;

a second plate stack configured to be placed in thermal communication with the second electrical component, the second plate stack having a plurality of second plates interleaved with the first plates; and a temperature responsive actuator coupled to at least one of the first and second plate stacks, the temperature responsive actuator changing shape based on changes in temperature to change relative positions of the first and second plates, the temperature responsive actuator causing the first and second plates to vary thermal resistance between the first and second electrical components based on the change in the relative positions of the first and second plates.

2. The thermal bridge of claim 1, wherein the first plate stack includes a first base configured to be mounted in direct thermal contact with the first electrical component, the first plates being integral with and extending from the first base, the second plate stack includes a second base configured to be mounted in direct thermal contact with the second electrical component, the second plates being integral with and extending from the second base.

3. The thermal bridge of claim 1, wherein the first plates are generally parallel and separated by first channels, the second plates being generally parallel and separated by second channels, the second plates being received in the first channels and the first plates being received in the second channels.

4. The thermal bridge of claim 1, wherein the first and second plates are separated by gaps, the temperature responsive actuator changing sizes of the gaps as the temperature responsive actuator changes shape to vary the thermal resistance between the first and second electrical components.

5. The thermal bridge of claim 1, wherein the temperature responsive actuator includes a band wrapping around the first and second plate stacks, the band changing shape as the temperature responsive actuator expands and contracts.

6. The thermal bridge of claim 1, wherein the temperature responsive actuator includes a first member and a second member coupled to the first member, the first member changing shape with respect to the second member based on temperature of the first member and temperature of the second member.

7. The thermal bridge of claim 1, wherein the first member has a lower coefficient of thermal expansion than the second member.

8. The thermal bridge of claim 1, wherein the temperature responsive actuator is a bimetal spring having a first member and a second member, the first and second members expanding and contracting at different rates based on changes in temperature of the first and second members.

9. The thermal bridge of claim 1, wherein the temperature responsive actuator contracts when cooled to compress the first and second plate stacks causing the first and second plates to move closer to each other.

10. The thermal bridge of claim 1, wherein the temperature responsive actuator contracts when heated to compress the first and second plate stacks causing the first and second plates to move closer to each other.

11. A thermal bridge between first and second electrical components, the thermal bridge comprising:

a first plate stack having a first base and a plurality of first plates extending from the first base, the first plates being separated by first channels, the first base being configured to be placed in thermal communication with the first electrical component;

a second plate stack having a second base and a plurality of second plates extending from the second base, the second plates being separated by second channels, the second base being configured to be placed in thermal communication with the second electrical component, the second plates being received in the first channels and the first plates being received in the second channels such that gaps are defined between the first and second plates; and a temperature responsive actuator coupled to at least one of the first and second plate stacks, the temperature responsive actuator changing shape based on changes in temperature to cause the first plates and the second plates to change relative positions and change sizes of the gaps to vary thermal resistance between the first and second electrical components.

12. The thermal bridge of claim 11, wherein the temperature responsive actuator includes a band wrapping around the first and second plate stacks, the band changing shape as the temperature responsive actuator expands and contracts.

13. The thermal bridge of claim 11, wherein the temperature responsive actuator includes a first member and a second member coupled to the first member, the first member changing shape with respect to the second member based on temperature of the first member and temperature of the second member.

14. The thermal bridge of claim 11, wherein the first member has a lower coefficient of thermal expansion than the second member.

15. The thermal bridge of claim 11, wherein the temperature responsive actuator is a bimetal spring having a first member and a second member, the first and second members expanding and contracting at different rates based on changes in temperature of the first and second members.

16. The thermal bridge of claim 11, wherein the temperature responsive actuator contracts when cooled to compress the first and second plate stacks causing the first and second plates to move closer to each other.

17. The thermal bridge of claim 11, wherein the temperature responsive actuator contracts when heated to compress the first and second plate stacks causing the first and second plates to move closer to each other.

18. An electronic device comprising:

a first electrical component;

a second electrical component; and a thermal bridge between the first and second electrical components, the thermal bridge comprising a first plate stack in thermal communication with the first electrical component and a second plate stack in thermal communication with the second electrical component, the first plate stack having a plurality of first plates, the second plate stack having a plurality of second plates interleaved with the first plates, the thermal bridge comprising a temperature responsive actuator coupled to at least one of the first and second plate stacks, the temperature responsive actuator changing shape based on changes in temperature to change relative positions of the first and second plates, the temperature responsive actuator causing the first and second plates to vary thermal resistance between the first and second electrical components based on the change in the relative positions of the first and second plates.

19. The electronic device of claim 18, wherein the first plates are generally parallel and separated by first channels, the second plates being generally parallel and separated by second channels, the second plates being received in the first channels and the first plates being received in the second channels with gaps therebetween, the temperature responsive actuator changing sizes of the gaps as the temperature responsive actuator changes shape to vary the thermal resistance between the first and second electrical components.

20. The electronic device of claim 18, wherein the temperature responsive actuator includes a band wrapping around the first and second plate stacks, the band changing shape as the temperature responsive actuator expands and contracts.

* * * * *